US008866264B2

(12) United States Patent
Kubo

(10) Patent No.: US 8,866,264 B2
(45) Date of Patent: Oct. 21, 2014

(54) SEMICONDUCTOR DEVICE AND MANUFACTURING METHOD OF THE SAME

(71) Applicant: Masahiko Kubo, Hyogo (JP)

(72) Inventor: Masahiko Kubo, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/671,349

(22) Filed: Nov. 7, 2012

(65) Prior Publication Data
US 2013/0134564 A1 May 30, 2013

(30) Foreign Application Priority Data

Nov. 28, 2011 (JP) ................................. 2011-259639
Mar. 29, 2012 (JP) ................................. 2012-078381

(51) Int. Cl.
*H01L 29/417* (2006.01)
*H01L 29/06* (2006.01)
*H01L 29/08* (2006.01)
*H01L 29/66* (2006.01)
*H01L 21/28* (2006.01)
*H01L 29/732* (2006.01)
H01L 29/16 (2006.01)
H01L 29/20 (2006.01)

(52) U.S. Cl.
CPC ........ *H01L 29/0607* (2013.01); *H01L 29/0804* (2013.01); *H01L 29/66295* (2013.01); *H01L 21/28* (2013.01); *H01L 29/1608* (2013.01); *H01L 29/2003* (2013.01); *H01L 29/732* (2013.01)
USPC .................... 257/587; 257/517; 257/E29.114

(58) Field of Classification Search
USPC .................................. 257/517, 587, E29.114
See application file for complete search history.

(56) References Cited

U.S. PATENT DOCUMENTS

| | | | | |
|---|---|---|---|---|
| 3,432,920 A | * | 3/1969 | Rosenzweig | 438/542 |
| 4,485,393 A | * | 11/1984 | Kumamaru et al. | 257/536 |
| 4,669,177 A | * | 6/1987 | D'Arrigo et al. | 438/204 |
| 4,752,817 A | * | 6/1988 | Lechaton et al. | 257/517 |
| 5,296,391 A | * | 3/1994 | Sato et al. | 438/341 |
| 5,486,704 A | * | 1/1996 | Morishita | 257/9 |
| 6,828,649 B2 | * | 12/2004 | Desko et al. | 257/517 |
| 2006/0170004 A1 | * | 8/2006 | Toyoda et al. | 257/197 |
| 2007/0145531 A1 | * | 6/2007 | Sung | 257/565 |
| 2008/0150082 A1 | * | 6/2008 | Zupac et al. | 257/565 |

FOREIGN PATENT DOCUMENTS

| | | |
|---|---|---|
| JP | 52-035584 | 3/1977 |
| JP | 59-169152 | 9/1984 |
| JP | 04-317321 | 11/1992 |
| JP | 06-314696 | 11/1994 |
| JP | 07-161880 | 6/1995 |
| JP | 10-340863 | 12/1998 |
| JP | 2001-284282 | 10/2001 |
| JP | 2009-021515 | 1/2009 |

OTHER PUBLICATIONS

Japanese Office Action dated Oct. 30, 2012, filed in Japanese counterpart Application No. 2012-078381, 4 pages (in English).

* cited by examiner

*Primary Examiner* — Victor A Mandala
(74) *Attorney, Agent, or Firm* — Patterson & Sheridan, LLP

(57) ABSTRACT

A semiconductor device implemented with structures to suppress leakage current generation during operation and a method of making the same is provided. The semiconductor device includes a semiconductor substrate of first conductivity type, a second insulation film, which has at least one aperture between first and second apertures, formed on top of a first insulation film. The semiconductor device layer structure accommodates tensile stress differences between device layers to suppress lattice dislocation defects during device manufacturing and thus improves device reliability and performance.

18 Claims, 9 Drawing Sheets

US 8,866,264 B2

SEMICONDUCTOR DEVICE AND MANUFACTURING METHOD OF THE SAME

CROSS-REFERENCE TO RELATED APPLICATION

This application is based upon and claims the benefit of priority from Japanese Patent Application No. 2011-259639, filed Nov. 28, 2011 and Japanese Patent Application No. 2012-078381, filed Mar. 29, 2012; the entire contents of which are incorporated herein by reference.

FIELD

Embodiments described herein relate to a semiconductor device and a manufacturing method of the same.

BACKGROUND

In semiconductor devices and the like, miniaturization of the transistor cell size and multi-layer wiring in System On Chip devices (System on a Chip; SoC), have become important. Due to this miniaturization, it has become difficult to ensure the reliability and durability of these device types.

DETAILED DESCRIPTION

Figure 1:
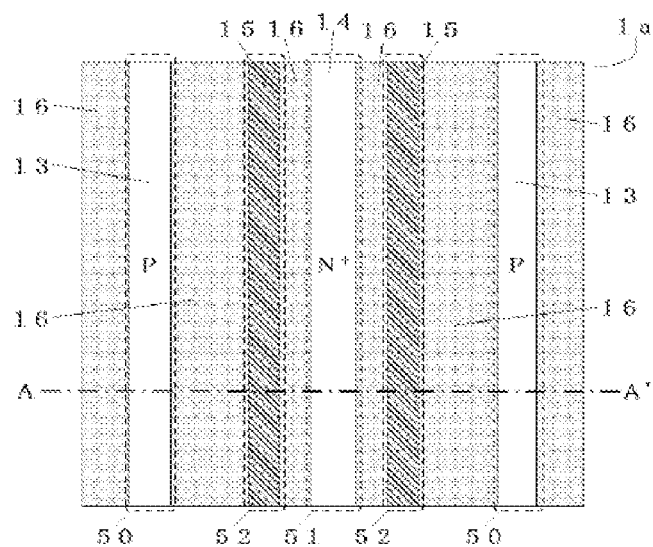
FIG. 1 is a top view diagram showing the structure of a semiconductor device according to a first embodiment.

In general, example embodiments will be described with reference to the figures. In these embodiments though the first conductivity type will be described as N-type and the second conductivity type as P-type, it is also possible to implement these embodiments with the first conductivity type as P-type and second conductivity type as N-type.

Also, in the descriptions below, the notations $N^+$, N, $N^-$ and $P^+$, P, $P^-$ represent the relative impurity concentration in each conductivity type, from high to low. That is, $N^+$ represents a relatively high N-type impurity concentration as compared to N, and likewise for $P^+$ and P.

The disclosure describes a semiconductor device that suppresses leakage current and a manufacturing method for the same.

The semiconductor device of example embodiments has a semiconductor substrate of a first conductivity type and a first semiconductor layer of a second conductivity type disposed on one face of the semiconductor substrate. A second semiconductor layer of the first conductivity type is created in the first semiconductor layer, and a first insulation film is created on one surface (a face) of the semiconductor substrate. The first insulation film has first apertures created so as to form an opening to the first semiconductor layer, and a second aperture created so as to form an opening to the second semiconductor layer. A second insulation film is disposed on top of the first insulation film. The second insulation has at least one or more third aperture located between the first apertures and the second aperture. A first main electrode is formed on the other surface (the opposite face) of the semiconductor substrate. Second main electrodes are formed in (and above) the first apertures, and a third main electrode is formed in (and above) the second and third apertures.

In another example embodiment, applicable, for example, for use in integrated circuit devices, forms all three main electrodes on the same face of the semiconductor substrate, rather than using both faces of the substrate. A semiconductor device comprises a semiconductor substrate of a first conductivity type and a first semiconductor layer of a second conductivity type disposed on one surface side (a face) of the semiconductor substrate. A second semiconductor layer of the first conductivity type is formed in the first semiconductor layer, and a first insulation film is formed so as to be opposite to the first semiconductor layer and the second semiconductor layer. A second insulation film is then formed on top of the first insulation film. A first main electrode is formed to contact the semiconductor substrate beneath the first and second insulation films. Second main electrodes that penetrate the first insulation film and the second insulation film make contact with the first semiconductor layer. The third main electrode has a portion that penetrates through both the first insulation film and second insulation film to make contact with the second semiconductor layer and a portion that penetrates only through the second insulation film to make contact with the first insulation film.

A method of manufacturing embodiments of the disclosed semiconductor device has a process to create a first semiconductor layer of a second conductivity type on one face of a semiconductor substrate of a first conductivity type, a process to create a second semiconductor layer of the first conductivity type in the first semiconductor layer, and a process to create a first insulation film on top of the first semiconductor layer. The method further includes a process to create first apertures that are opposite the first semiconductor layer and a second aperture which will be opposite to the second semiconductor layer in the first insulation film once it has been formed. The method further includes a process to create a second insulation film on the upper surface of the first insulation film, and a process to create at least one or more third apertures in the second insulation film between the first apertures and the second aperture. The method includes a process to create a first main electrode on the other surface (face) of the semiconductor substrate, a process to create second main electrodes in the first apertures, and a process to create a third main electrode in the second aperture and the third aperture.

First Embodiment

Figure 2:
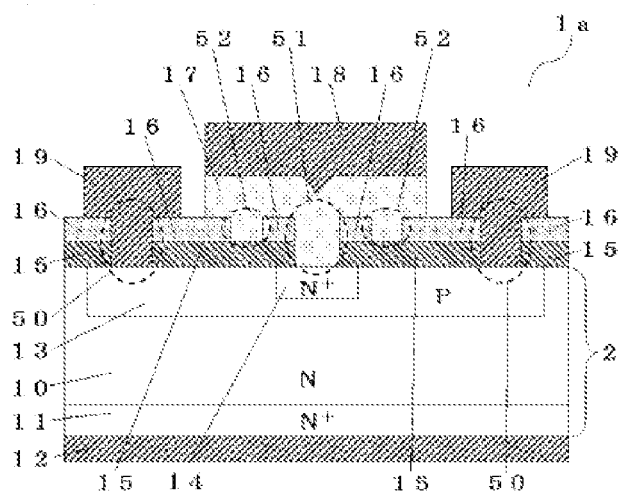
FIG. 2 is a vertical cross-section diagram showing the cross-section corresponding to the A-A' line of FIG. 1.

FIG. 1 is a top view diagram that shows the structure of semiconductor device la according to the first embodiment. FIG. 2 is a cross-section diagram that shows the cross-section corresponding to the A-A' line of FIG. 1. In FIG. 1, an extraction electrode 17, an emitter electrode 18, and a base electrode 19, which are depicted in FIG. 2, are omitted.

As shown in FIGS. 1 and 2, semiconductor device 1a has an $N^+$-type collector layer 11 on one side (face) of semiconductor substrate 2. Semiconductor substrate 2 has an N-type region that forms collector layer 10. A collector electrode 12 (first main electrode) is disposed so as to be in contact with the $N^+$-type collector layer 11.

A P-type base layer 13 (first semiconductor layer) is disposed on the other side of semiconductor substrate 2, and an $N^+$-type emitter layer 14 (second semiconductor layer) is formed on some portion of the upper surface of P-type base layer 13. An insulation film 15 (first insulation film) is formed on the upper surface of P-type base layer 13 and $N^+$-type emitter layer 14. The insulation film 15 may be, for example Silicon Dioxide ($SiO_2$), but other insulating materials may be implemented and there is no particular limitation on possible insulator materials which might be used.

Insulation film 15 has base apertures 50 (first aperture) formed so as to be opposite and open to the P-type base layer 13 and an emitter aperture 51 (second aperture) formed so as to be opposite and open to the $N^+$-type emitter layer 14.

A nitride film 16 (second insulation film) is created on the upper surface of the insulation film 15 described above. The nitride film 16 may be, for example, silicon nitride ($Si_3N_4$) or the like, but there are no particular limitations on possible insulation materials which might be used. In the embodiment disclosed herein, the second insulation film is a nitride film, but this is not intended as a limitation on possible compositions of such a film and other insulating materials may be used. The nitride film 16 of semiconductor device la has nitride film apertures 52 (third aperture) created in between the base apertures 50 and the emitter aperture 51, as shown in FIGS. 1 and 2.

The extraction electrode 17 (third main electrode) is formed in the nitride film aperture 52 and the emitter aperture 51. The emitter electrode 18 is formed on the upper surface of extraction electrode 17. The base electrodes (second main electrode) 19 are formed in the base apertures 50.

For the extraction electrode 17 a polysilicon doped with arsenic (As), for example, may be used as the conductive material. For emitter electrode 18 and the base electrodes 19 aluminum (Al), for example, may be used as the conductive material. Collector electrode 12 could use, for example, gold (Au) or silver (Ag) paste as the conductive material. However, since these are merely examples, there are no particular limitations implied by these material selections and other conductive materials may be used to form the various electrodes.

As depicted in FIGS. 1 and 2, two nitride film apertures 52 have been formed so as to be symmetrically placed on either side of emitter aperture 51, but this is an example, and there are no particular limitations on aperture locations or number. However, symmetrical placement, as depicted in FIGS. 1 and 2, makes it somewhat easier to achieve the beneficial effects to be described for the first embodiment.

The semiconductor device 1a, when configured as described above, has an NPN-type bipolar transistor structure, which operates as follows: when the forward bias of the PN junction formed by the P-type base layer 13 and the $N^+$-type collector layer 11 is applied to the base electrode 19 the base current is made to flow. Due to the flow of this base current, semiconductor device lawill be in the ON state, and electrons will flow from the emitter electrode 18 to the collector electrode 12 via the $N^+$-type emitter layer 14, the N-type collector layer 10, and the $N^+$-type collector layer 11. That is, current will flow from the collector electrode 12 to the emitter electrode 18.

Amplification operations, switching operations, or the like are example applications of such a NPN-type bipolar transistor structure. For example, in an amplification operation, the collector current flowing from the collector changes in proportion to the base current. This amplification operation is utilized, for example, in the signal amplification of mobile phones.

In the case of semiconductor device 1a, by creating the third apertures 52 (nitride film apertures) in between the base apertures 50 and the emitter aperture 51, the extraction electrode 17 is placed under a compressive stress relative to the semiconductor substrate 2 (P-type base layer 13) the influence of the nitride film 16 having a tensile stress relative to the semiconductor substrate 2 (P-type base layer 13) is reduced. As a result of the reduction in layer stress in the P-type base layer 13, it is possible to suppress the crystal defects which may occur during thermal processing during the manufacturing of semiconductor device 1a. By suppressing the generation of lattice defects caused by stress it is possible to reduce the leakage current (leakage current between the emitter electrode 18 and the base electrode 19) that is generated in semiconductor device 1a.

Consequently, it is possible to solve or mitigate the various problems that are caused by leakage current. For example, the failure rate of the semiconductor device 1a may be lowered and it is, thus, possible to increase the lifespan of the semiconductor device 1a. In addition, it is also possible to suppress the non-uniformity of signal amplification of the semiconductor device 1a caused by the leakage current.

Figure 3:
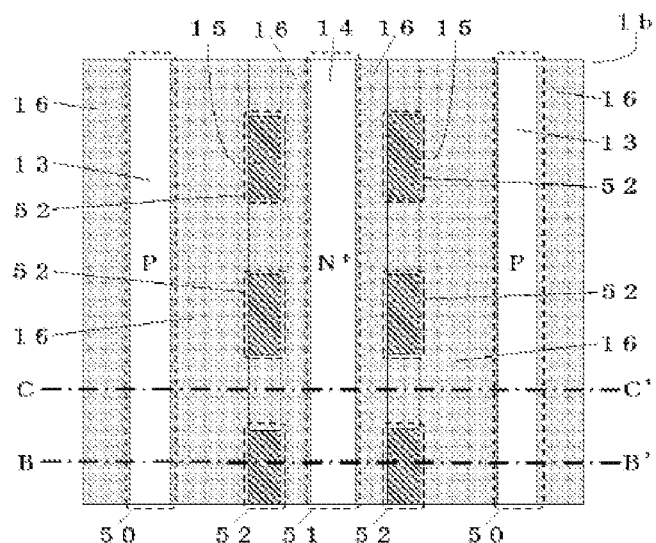
FIG. 3 is a top view diagram showing the structure of a semiconductor device according to a first modified example of the first embodiment.
Figure 4:
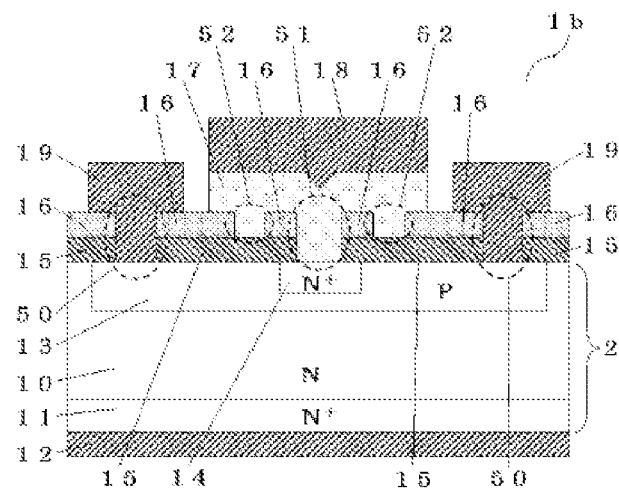
FIG. 4 is a vertical cross-section diagram showing the cross-section corresponding to the B-B' line of FIG. 3.
Figure 5:
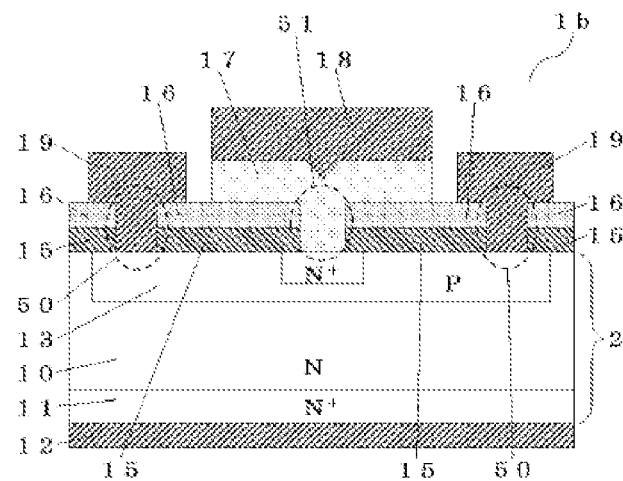
FIG. 5 is a vertical cross-section diagram showing the cross-section corresponding to the C-C' line of FIG. 3.

The first embodiment maybe modified in a manner similar to that depicted in FIGS. 3 to 5. FIG. 3 is a top view diagram that shows the structure of semiconductor device 1b according to a modified example of the first embodiment. FIG. 4 is a vertical cross-section diagram that shows the cross-section corresponding to the B-B' line of FIG. 3. FIG. 5 is a vertical cross-section diagram that shows the cross-section corresponding to the C-C' line of FIG. 3. In FIG. 3, the extraction electrode 17, the emitter electrode 18, and the base electrode 19 have been omitted from the depiction. Also, the parts of the modified example embodiment which are common to the first embodiment as depicted in FIGS. 1 and 2 will be represented by the same legend symbol.

Semiconductor device 1b differs from semiconductor device 1a in that the nitride film apertures 52 formed in the nitride film 16 have been created as intermittent structures, as shown in FIG. 3, rather than as continuous lines extending in the plane of substrate 2 as shown in FIG. 1. That is, the vertical cross-section view of the portions where the nitride film apertures 52 are created as in FIG. 4 is the same as that in the case of the first embodiment (as shown in FIG. 2). However, the vertical cross-section view of the portions where the nitride film apertures 52 are not formed (e.g., at line C-C' as in FIG. 5), looks the same as a cross-section of a device in which no film apertures 52 were formed in nitride film 16.

It is still possible using the intermittent structures of semiconductor device 1b to suppress the crystal defects that occur during the thermal processing associated with the manufacturing process of semiconductor device 1b. Consequently, it is still possible to suppress the leakage current (leakage current between the emitter electrode 18 and the base electrode 19) and achieve beneficial results with respect to device reliability, lifetime, and performance.

Figure 6:
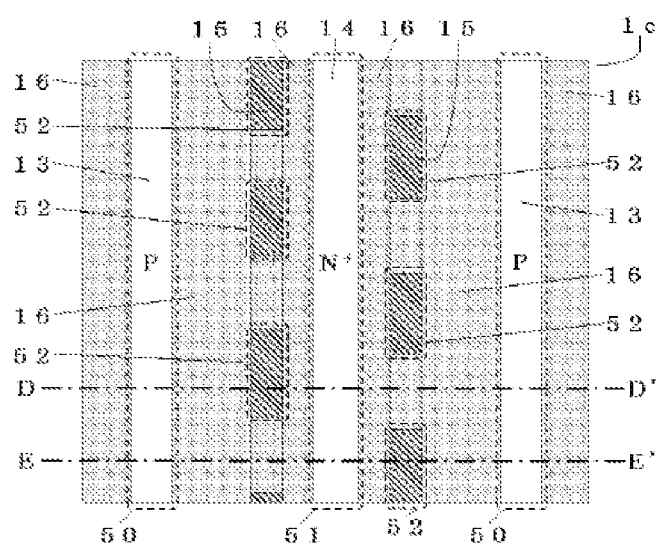
FIG. 6 is a top view diagram showing the structure of a semiconductor device according to a second modified example of the first embodiment.
Figure 7:
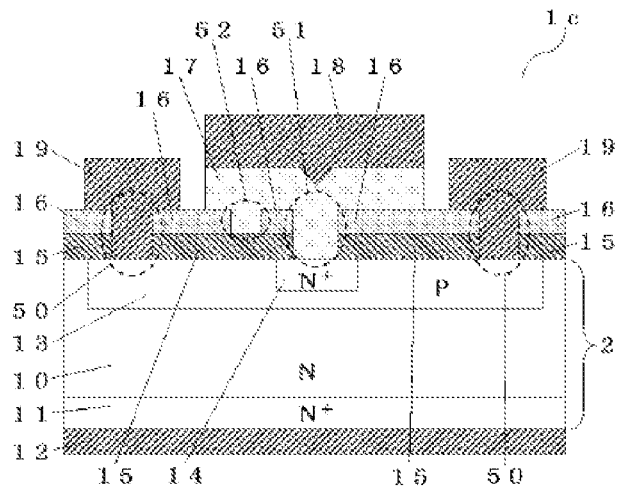
FIG. 7 is a vertical cross-section diagram showing the cross-section corresponding to the D-D' line of FIG. 6.
Figure 8:
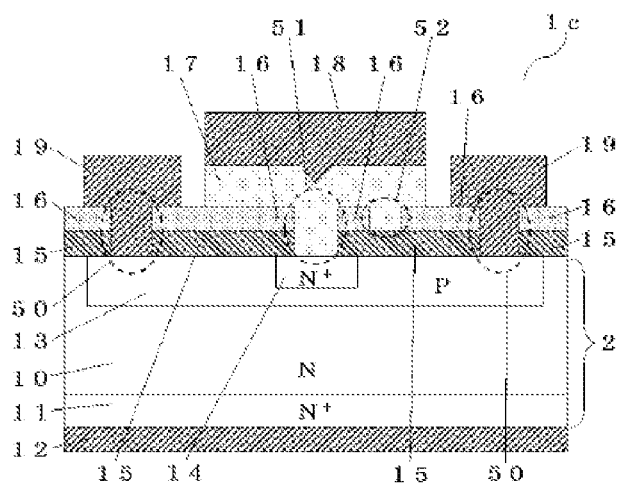
FIG. 8 is a vertical cross-section diagram showing the cross-section corresponding to the E-E' line of FIG. 6.

The first embodiment may also be modified in a manner similar to that shown in FIGS. 6 to 8. FIG. 6 is a top view diagram that shows the structure of the semiconductor device 1c according to a second modification to the first embodiment. FIG. 7 is a vertical cross-section diagram that shows the cross-section corresponding to the D-D' line of FIG. 6. FIG. 8 is a vertical cross-section diagram that shows the cross-section corresponding to the E-E' line of FIG. 6. In FIG. 6, the extraction electrode 17, the emitter electrode 18, and the base electrode 19 have been omitted from the depiction. Also, the parts of this modified example embodiment which are common to the first embodiment, as depicted in FIG. 1 and FIG. 2, will be represented by the same legend symbol.

Semiconductor device 1c differs from semiconductor device 1a and semiconductor device 1b in that the nitride film apertures 52 formed in the nitride film 16 are, as shown in FIGS. 6 to 8, not symmetrical around the emitter aperture 51.

With this second modified example of the first embodiment, it is still possible to suppress the crystal defects that occur during thermal processing associated with the device manufacturing process. Consequently, it is possible to suppress the leakage current (leakage current between the emitter electrode 18 and the base electrode 19) and achieve beneficial results with respect to device reliability, lifetime, and performance.

Figure 9:
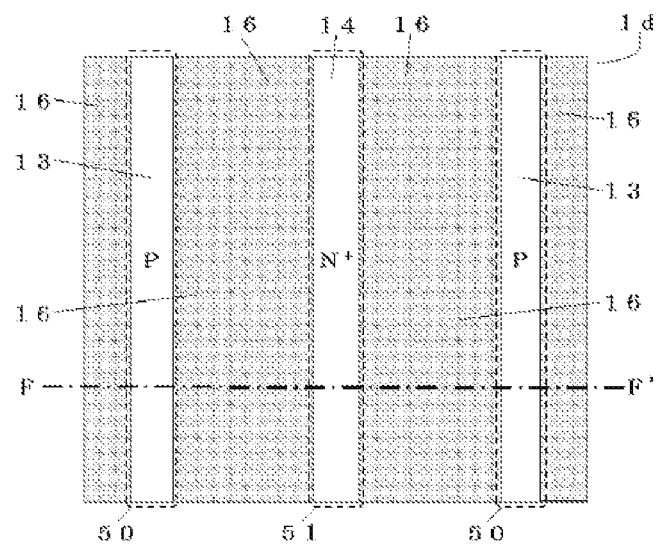
FIG. 9 is a top view diagram showing the structure of a semiconductor device of a first comparative example.
Figure 10:
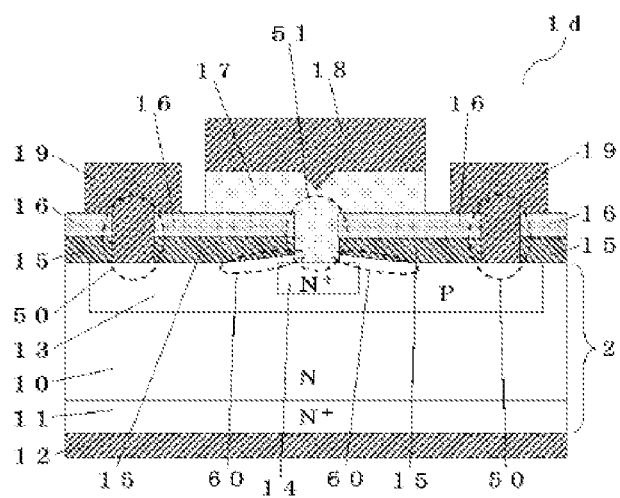
FIG. 10 is a vertical cross-section diagram showing the cross-section corresponding to the F-F' line of FIG. 9.

Now the structure of an existing semiconductor device 1d will be described for a comparison with described embodiments. FIG. 9 is a top view diagram that shows the structure of semiconductor device 1d. FIG. 10 is a vertical cross-section diagram that shows the cross-section corresponding to the F-F' line of FIG. 9. In FIG. 9, the extraction electrode 17, the emitter electrode 18, and the base electrode 19 have been omitted from the depiction. Each part of comparison example semiconductor device 1d which is common with the semiconductor device 1a will be represented by the same legend symbol.

Semiconductor device 1d differs from the semiconductor devices 1a, 1b, 1c in that the nitride film apertures 52 are absent. For a device with the structure of semiconductor device 1d, when the temperature rises during the manufacturing process lattice damage caused by stress mismatches between the layers may cause the generation of a leakage current pass-through area 60. The leakage current pass through area increases leakage current flow in the device. Increased leakage current flow will cause problems with device performance (e.g., amplification uniformity) and may even result in the complete failure of semiconductor device 1d.

The reason leakage current pass-through area 60 forms is believed to be due to the occurrence of thermal stress generated by heat treatment during manufacturing. Nitride film 16 has a tensile stress relative to the semiconductor substrate 2 (P-type base layer 13, $N^+$-type emitter layer 14) at elevated temperatures during the manufacturing process. When device is heated the tensile stress of the nitride film 16 causes edge dislocation defects in semiconductor substrate 2 (P-type base layer 13, $N^+$-type emitter layer 14), and the leakage current pass-through area 60, as depicted in FIG. 10, is generated. In addition, the atomic arrangement within the crystal lattice of the semiconductor substrate 2 (P-type base layer 13, $N^+$-type emitter layer 14) in which edge dislocation occurs, will be in a partially broken state.

Current methods of solving this problem of nitride film stress induced dislocations are explained by reference to comparative examples depicted in FIG. 11 and FIG. 12.

First, the comparative example semiconductor device 1e will be described. FIG. 11 shows a vertical cross-section diagram representing the cross-section of semiconductor device 1e. Each part of this comparative example that corresponds to the semiconductor device 1a shown in FIG. 2 will be represented by the same legend symbol.

Semiconductor device 1e 2 differs from semiconductor devices 1a, 1b, 1c of the first embodiment in that the nitride film apertures 52 are not created and the nitride film 16 is thinner. Semiconductor device 1e differs from semiconductor device 1d, in that nitride film 16 is thinner. A thinner nitride film 16 produces less tensile stress on the semiconductor substrate 2 (P-type base layer 13), which will result in less lattice damage and a suppression of the formation of the leakage current pass-through area 60.

However, if a thin nitride film 16 then, during the manufacturing of the emitter electrode 18 and the base electrode 19 by Reactive Ion Etching (Reactive Ion Etching; RIE), an excessive etching area 61, as depicted in FIG. 11, may be generated in semiconductor device 1e. This excessive etching area 61 is caused by inadvertent etching through the nitride film 16 during the etch processing of electrodes 18 and 19. Once the etch process breaks through the nitride layer 16, insulator film 15 will generally etch relatively quickly and excess etch area 61 will, consequently, be formed Excessive etching area 61 causes a new, different problem like surface recombination leakage current on the semiconductor substrate 2, which may cause of the failure or degradation in the performance characteristics of semiconductor device 1e.

Next, the comparative example of semiconductor device 1f will be described. FIG. 12 shows a vertical cross-section diagram representing the cross-section of semiconductor device 1f. Each part of semiconductor device 1f that has the same part as the semiconductor device 1a will be represented by the same legend symbol.

Semiconductor device 1f differs from the semiconductor devices 1a, 1b, 1c in that nitride film apertures 52 are not formed and the extraction electrode is also relatively thicker. Semiconductor device 1f differs from semiconductor device 1d in that the thickness of the extraction electrode 17 is formed relatively thicker than in semiconductor device 1d. More specifically, in the case of the semiconductor devices 1a, 1b, 1c and the semiconductor devices 1d, 1e the thickness of the extraction electrode 17 may be approximately 0.4 μm, but the thickness of the extraction electrode 17 of the semiconductor device 1f may be 0.5 μm or more. The objective of this thicker extraction electrode can be given as, the utilization of the fact that an arsenic doped polysilicon used for the extraction electrode 17, has a compressive stress relative to the semiconductor substrate 2 (P-type base layer 13). By making the extraction electrode 17 thicker, the compressive stress is increased, and the influence of the tensile stress of the nitride film 16 is reduced. Matching compressive and tensile forces makes it possible to suppress the formation of the leakage current pass-through area 60 during thermal processing.

Figure 12:
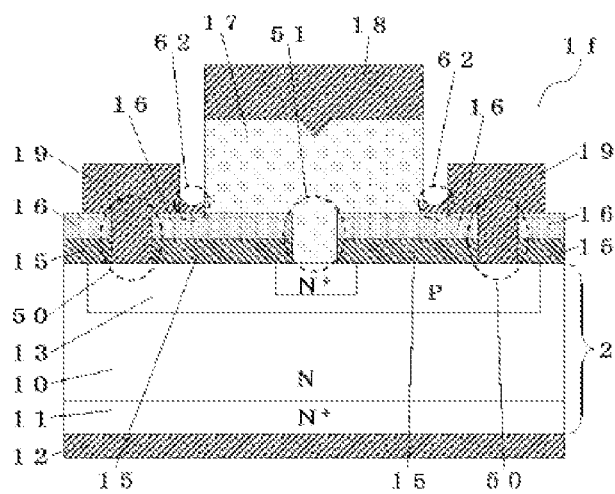
FIG. 12 is a vertical cross-section diagram that shows the cross-section of a semiconductor device of a third comparative example.

However, if a thick extraction electrode 17 is formed as in semiconductor device 1f, then during the manufacturing of the emitter electrode 18 and the base electrode 19 by RIE, a residual electrode 62, as depicted in FIG. 12, may be generated. This is because in narrow areas such as the space between the emitter electrode 18 and the base electrode 19, etching by RIE may be hindered, and if the extraction electrode 17 is made thicker, it may not be possible to completely divide/separate the space between the emitter electrode 18 and the base electrode 19, and residual electrode 62 gets generated.

In the case of a semiconductor device 1f which has the residual electrode 62, since the emitter electrode 18 and the base electrode 19 are in a state wherein they are electrically connected, they short, and as a result semiconductor device 1f fails.

In the case of the semiconductor devices 1a, 1b, 1c, by creating nitride film apertures 52 in the nitride film 16 provided with the extraction electrode 17 having a compressive stress relative to the semiconductor substrate 2 (P-type base layer 13), the influence of the nitride film 16 having a tensile stress corresponding to the semiconductor substrate 2 (P-type base layer 13) is reduced. Since the thickness of the nitride film 16 or the extraction electrode 17 of the semiconductor devices 1a, 1b, 1c of the first embodiment are the same as the thickness of the nitride film 16 or the extraction electrode 17 in the existing semiconductor device 1d, the problems depicted in FIG. 11 (semiconductor device 1e) and FIG. 12 (semiconductor device 1f) do not occur.

Figure 13:
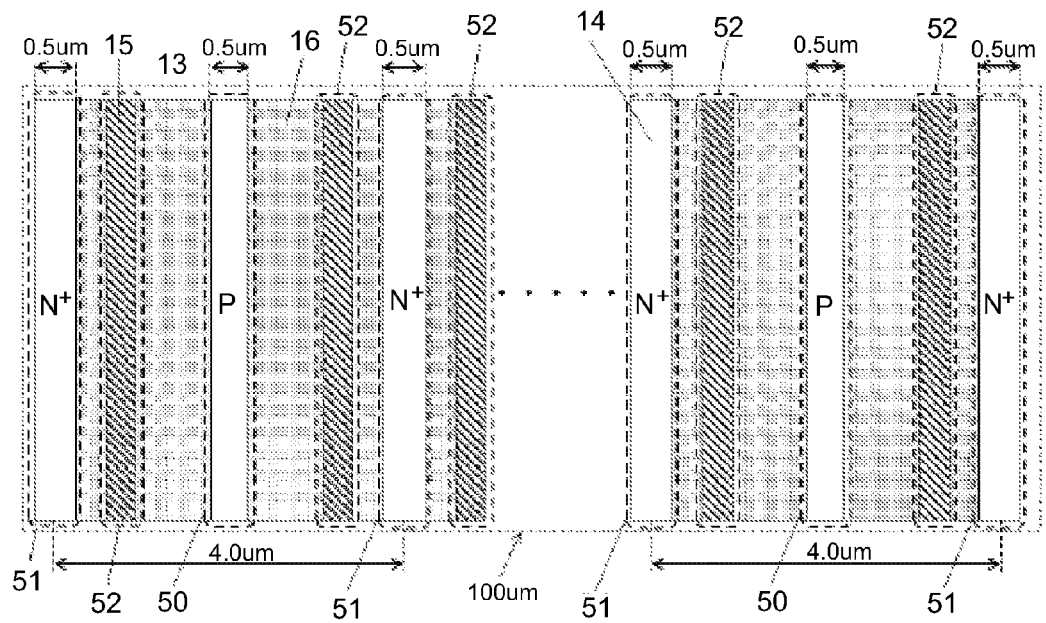
FIG. 13 is a top view diagram that shows the dimensions of an example embodiment of the semiconductor device of the first embodiment used for simulation purposes.

The results of leakage current simulations for comparison between semiconductor device 1a and semiconductor device 1d will be described. FIG. 13 shows a top view that shows example dimensions of the semiconductor device 1a and semiconductor device 1d used for simulation purposes. As shown in FIG. 13, comparisons are made for the case when the width of the base apertures 50 and the emitter aperture 51 are 0.5 μm, the length of the space between the emitter apertures are 4.0 μm, the perimeter is approximately 100 μm.

If there are no nitride film apertures 52, as in the existing semiconductor device 1d, then when simulation is carried out with the dimensions shown in FIG. 13, the leakage current between the emitter electrode 18 and the base electrode is approximately 120 nA. When the performance of semiconductor device 1a is simulated using the dimensions shown in FIG. 13, the leakage current is approximately 30 nA. In this manner, by creating nitride film apertures 52 as in the first embodiment, it is possible to reduce the leakage current between the emitter electrode 18 and the base electrode 19 by about 75%.

Next, the manufacturing method of the semiconductor device 1a will be described by referring to FIGS. 14A to 14H. FIGS. 14A to 14H are the vertical cross-section diagrams of the semiconductor device 1a for each manufacturing process. Similar manufacturing methods may be used to form other described embodiments.

Figure 14A:
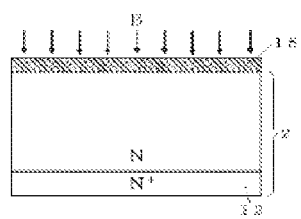
FIGS. 14A to 14H are vertical cross-section diagrams of the semiconductor device of the first embodiment at each step of the manufacturing process.

First, as shown in FIG. 14A, insulation film 15 is deposited on one side of the semiconductor substrate 2, which is, in this embodiment, a N$^+$/N-type semiconductor, at a deposition temperature of approximately 900 to 1000° C. Then, boron (B), which is a P-type impurity, is ion-implanted and post-implant annealing is carried out at an annealing temperature of approximately 900 to 1000° C. Here, although it is being assumed that $SiO_2$ will be used in the insulation film 15, this is only an example, and it need not be limited to $SiO_2$. Also, although boron (B) has been cited as an example dopant, any P-type impurity ion, for example boron fluoride ($BF_2$) or other P-type dopant may be implemented.

Figure 14B:
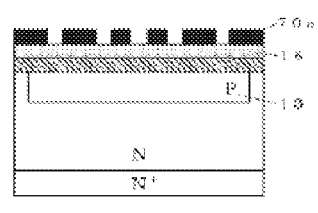
Figure 14C:
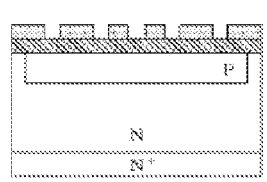

As shown in FIG. 14B, due to the annealing process the ion-implanted boron (B) undergoes thermal diffusion, and the P-type base layer 13 is formed. After this the nitride film 16 is deposited on the upper surface of the insulation film 15 at a deposition temperature of approximately 700° C. A resist mask 70a, as shown in FIG. 14B, is then formed on the upper surface of the nitride film 16. By carrying out anisotropic etching on some parts of the nitride film 16 by RIE and then removing the resist mask 70a with an oxygen asher (or other methods), the structure as shown in FIG. 14C is achieved.

Figure 14D:
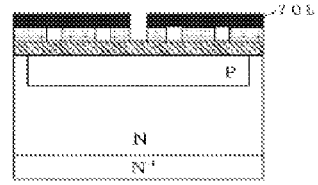

Next, as shown in FIG. 14D, a resist mask 70b is formed such that all regions other than the region where the emitter electrode 18 will be finally connected are masked, and wet etching of the insulation film 15 is carried out with, for example, hydrogen fluoride (HF). Then, the resist mask 70b is removed by an oxygen asher (or other methods).

Figure 14E:
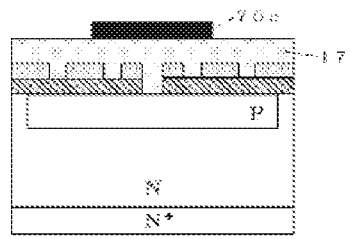
Figure 14F:
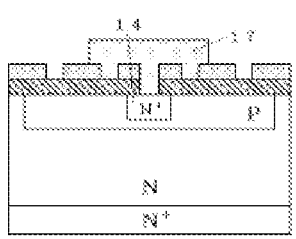

Arsenic-doped polysilicon, which will be the extraction electrode 17, is then deposited on the upper surface of P-type base layer 13, insulation film 15, and nitride film 16. Resist mask 70c, as shown in FIG. 14E, is then formed on the doped polysilicon layer that will be used to form extraction electrode 17. The patterning of exaction electrode 17 may be carried out by RIE. After the resist mask 70c is removed, annealing is carried out at 900 to 1000° C., and thermal diffusion of arsenic, which is an N-type impurity, is done to form the N$^+$-type emitter layer 14, and the structure as shown in FIG. 14F is achieved.

Next, wet etching of the insulation film 15 may be carried out with hydrogen fluoride, and the base apertures 50 where the base electrodes 19 will be disposed are formed. Since the nitride film 16 and the extraction electrode 17, which is arsenic-doped polysilicon, are resistant to hydrogen fluoride only the insulation film 15 undergoes etching. This method of forming base apertures 50 using the nitride film 16 has the advantage of being able to accurately position base apertures 50 in the desired position.

Figure 14G:
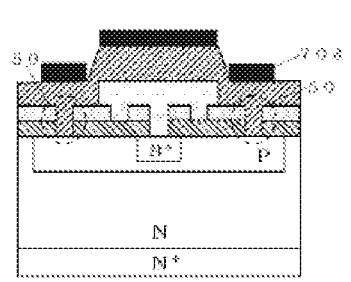

Next, as shown in FIG. 14G, metal, such as aluminum (Al), which will form emitter electrode 18, is deposited on the upper surface of the P-type base layer 13, the insulation film 15, the nitride film 16, and the extraction electrode 17. After emitter electrode metal deposition, resist mask 70d is formed. Patterning of the electrode metal layer is carried out by RIE to form the emitter electrode 18 and the base electrode 19. Then, on the other side of the semiconductor substrate 2, using gold (Au) or silver (Ag) paste materials (or the like) the collector electrode 12 is formed. By the above process, the semiconductor device 1a of the embodiment as shown in FIG. 14H can be achieved.

The annealing and deposition processes described in FIGS. 14A to 14H cause the exertion of tensile stress relative to the semiconductor substrate 2 (P-type base layer 13). The stresses applied during manufacturing of semiconductor device 1d produce a leak current pass-through area 60 shown in FIG. 10. The stresses applied during manufacturing of described embodiments may be much lower and thus a leak current pass-through area will not be formed (or formed to a lesser extent).

Figure 11:
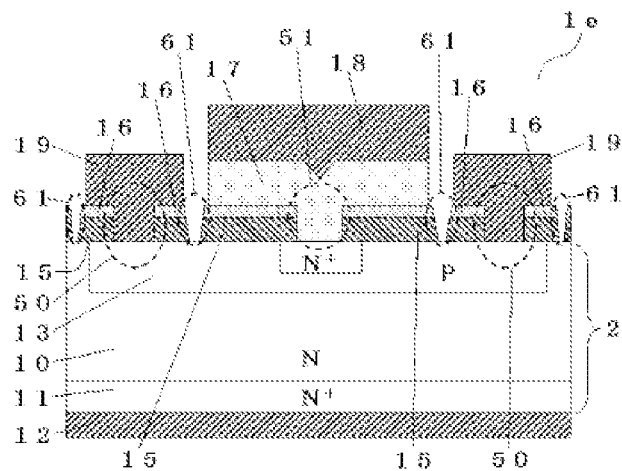
FIG. 11 is a vertical cross-section diagram showing the cross-section of a semiconductor device of a second comparative example.
Figure 14H:
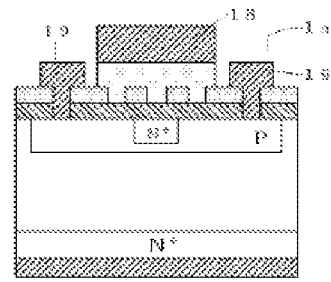

The comparative example semiconductor device 1e, shown in FIG. 11, is provided with a relatively thinner nitride film 16 than in the case of semiconductor device 1d, thus it is more likely that this thinner layer will be inadvertently etched through during patterning of emitter electrode 18 and base electrode 19 with RIE (the processing step between FIG. 14G and FIG. 14H). If thin nitride film 16 is etched through and insulation film 15 is exposed to etching, then a semiconductor device 1e with the excessive etching area 61, as shown in FIG. 11, will be formed.

The semiconductor device 1f, as depicted in FIG. 12, is provided with a thicker extraction electrode 17 than in the case of semiconductor device 1d, thus at the time of patterning the emitter electrode 18 and the base electrode 19 by RIE it is difficult to etch relatively narrow (high aspect ratio features) such as the space between the emitter electrode 18 and the base electrode 19. Because of this difficulty, semiconductor device 1f with the residual electrode 62 may be formed as shown in FIG. 12.

By creating the nitride film apertures 52, such as in semiconductor devices 1a, 1b, or 1c, it is possible to suppress the formation of the leakage current pass-through area 60, the excessive etching area 61, and the residual electrode 62.

Insulation film 15, nitride film 16, and extraction electrode 17, may be formed, for example, by, Low Pressure Chemical Vapor Deposition (Low Pressure Chemical Vapor Deposition; LPCVD) but other deposition techniques are possible and contemplated.

As an annealing method, although for example Rapid Thermal Annealing (RTA: Rapid Thermal Annealing) or Laser Annealing may be used, but there are no particular limitations and other annealing methods are possible and contemplated.

Although the emitter electrode 18 and the base electrode 19 are described as comprising aluminum (Al) as an example, they can be implemented with any conducting material, and there are otherwise no particular limitations on electrode materials.

Second Embodiment

Figure 15:
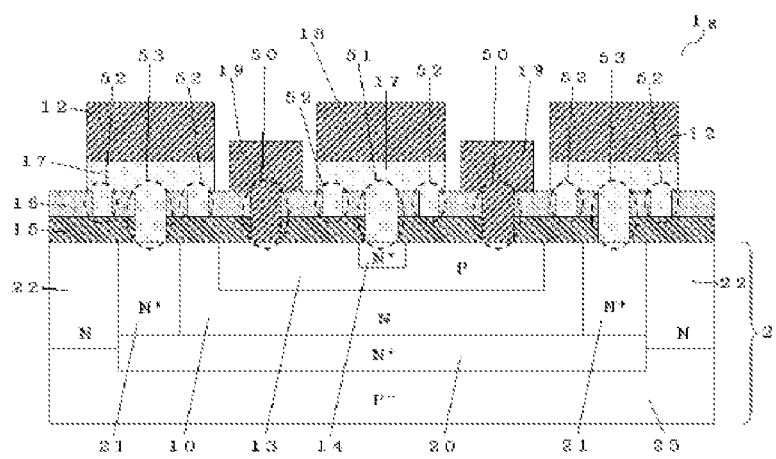
FIG. 15 is a vertical cross-section diagram showing the cross-section of a semiconductor device according to a second embodiment.

Semiconductor device 1g according to a second embodiment will be described using FIG. 15. FIG. 15 shows the vertical cross-section representing the cross-section of semiconductor device 1g according to the second embodiment. Each part of this second embodiment that is in common with semiconductor device 1a of the first embodiment will be represented by the same legend symbol.

Semiconductor device 1g differs from the first embodiment in that collector electrode 12 is formed on the same face of semiconductor substrate 2 as emitter electrode 18 and base electrode 19, rather than on the opposite face of semiconductor substrate 2. When used in integrated circuits (Integrated Circuits; IC), the structure used will generally be the second embodiment.

Semiconductor device 1g has an N$^+$-type-implanted collector layer 20 created in the semiconductor substrate 2 that has a P$^-$-type semiconductor layer 23. The N-type collector layer 10 and the P-type base layer 13 are created on the upper surface of the N$^+$-type-implanted collector layer 20. Next, the N$^+$-type emitter layer 14 is created on some portion of the upper surface of the P-type base layer 13. Also, the N$^+$-type diffusion collector layers 21 are created so as to make contact with the N-type collector layer 10 which is on the upper surface of the N$^+$-type-implanted collector layer 20. N-type breakdown voltage layers 22 are created on both ends of the semiconductor substrate 2.

The insulation film 15 is created on the upper surfaces of the N-type collector layer 10, the P-type base layer 13, the N$^+$-type emitter layer 14, the N$^+$-type diffusion collector layers 21, and the N$^+$-type breakdown voltage layers 22. As shown in FIG. 15, this insulation film 15 has base apertures 50 formed so as to be opposite to the P-type base layer 13, emitter aperture 51 formed so as to be opposite to the N$^+$-type emitter layer 14, and collector apertures 53 (second apertures) formed so as to be opposite to the N$^+$-type diffusion collector layers 21.

The nitride film 16 is created on the upper surface of the insulation film 15. The nitride film 16 of semiconductor device 1g has nitride film apertures 52 disposed, as shown in FIG. 15, between the base apertures 50 and the emitter aperture 51, and the base apertures 50 and the collector apertures 53. The extraction electrodes 17 are formed in (and above) the nitride film apertures 52, the emitter aperture 51, and the collector apertures 53.

The emitter electrode 18 is created on the upper surface of extraction electrode 17 disposed above emitter aperture 51 and nitride film apertures 52 proximate to emitter aperture 51. Collector electrodes 12 are created on the upper surface of the extraction electrodes 17 disposed above collector apertures 53 and nitride film apertures 52 proximate to each collector aperture 53. Base electrodes 19 are formed in the base apertures 50.

Although, as depicted in FIG. 15, the nitride film apertures 52 proximate to the emitter electrode, are created in two places so as to be symmetric along the longer direction of the emitter aperture 51, as in FIG. 1, this is an example, and there are no limitations on these formation locations or count. However, it somewhat easier to achieve the positive effects previously described by using a symmetric arrangement for the nitride film apertures, and the method of forming them symmetrically around emitter aperture 51 will be described as an example.

The semiconductor device 1g configured as described above, has an NPN-type bipolar transistor structure similar to semiconductor device 1a. Semiconductor device 1g operates as follows: first, forward bias of the PN junction formed by the P-type base layer 13 and the N$^+$-type diffusion collector layer 21 (W-type-implanted collector layer 20) is applied to the base electrodes 19, and base current is made to flow. Due to the flow of this base current, semiconductor device 1g will move to ON state, and electrons will flow from the emitter electrode 18 to the collector electrodes 12 via the N$^+$-type emitter layer 14, the N-type collector layer 10, the N$^+$-type-implanted collector layer 20, and the N$^+$-type diffusion collector layers 21. That is, current will flow from the collector electrode 12 to the emitter electrode 18.

By creating the nitride film apertures 52 (third apertures) in between the base apertures 50 and the emitter aperture 51 and in between the base apertures 50 and the collector apertures 53, the crystal defects that at increased temperatures of the manufacturing process are suppressed in semiconductor device 1g. As a result, it is possible to suppress the leakage current (leakage current between the emitter electrode 18 and the base electrode 19) and the problems caused by the leakage current. For example, it is possible to lower the failure rate of the semiconductor device 1g and to increase the lifespan of the semiconductor device 1g. It is also possible to suppress the non-uniformity of signal amplification of the semiconductor device 1g caused by to the leakage current.

Third Embodiment

Figure 16:
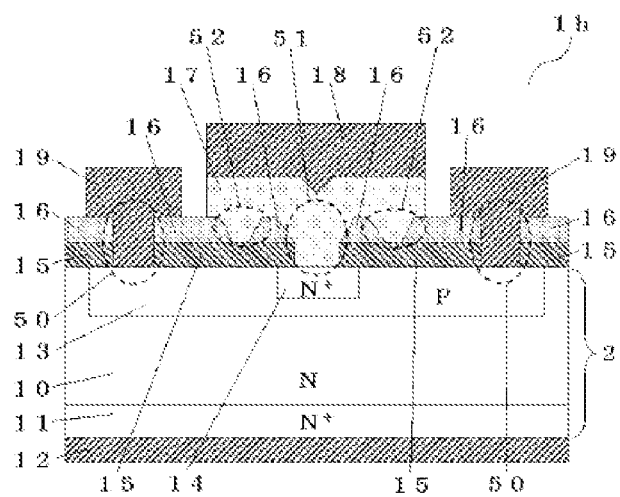
FIG. 16 is a vertical cross-section diagram showing the cross-section of a semiconductor device according to a third embodiment.
Figure 17:
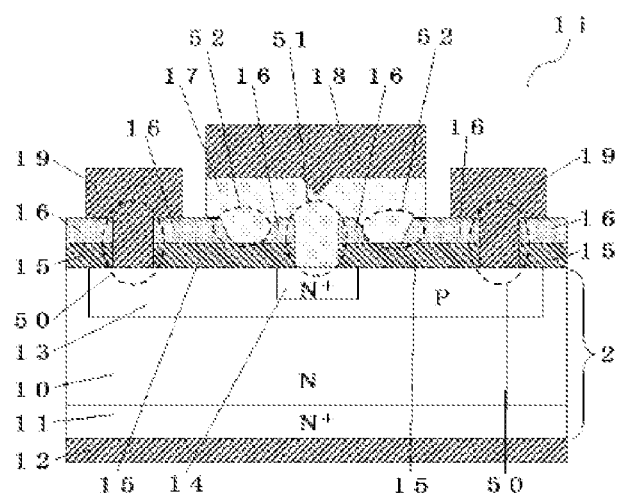
FIG. 17 is a vertical cross-section diagram showing the cross-section of another semiconductor device 1i according to the third embodiment.

The semiconductor device 1h according to a third embodiment will be described using FIG. 16 and FIG. 17. FIG. 16 is a vertical cross-section diagram showing the cross-section of semiconductor device 1h according to the third embodiment. FIG. 17 is a vertical cross-section diagram that shows the cross-section of the semiconductor device 1i also according to the third embodiment. The parts of the third embodiment that are in common with the semiconductor device 1a are represented by the same legend symbol.

The point by which the semiconductor device 1h of the third embodiment differs from the first embodiment is that the sidewall shape of the emitter aperture 51 and the nitride film apertures 52. The sidewalls of emitter aperture 51 and nitride film apertures 52 are a tapered shape, such that apertures are narrower at the bottom of nitride film 16 than at the top of nitride film 16.

Semiconductor device 1h has N⁺-type collector layer 11 disposed on the side of the semiconductor substrate 2 having N-type collector layer 10. The collector electrode 12 is formed so as to make contact with the N⁺-type collector layer 11.

P-type base layer 13 is formed on the other side of the semiconductor substrate 2. N⁺-type emitter layer 14 is formed on some portion of the upper surface of the P-type base layer 13. The insulation film 15 is formed on the upper surfaces of P-type base layer 13 and N⁺-type emitter layer 14. Insulation film 15 may be, for example, silicon dioxide ($SiO_2$) but, it is also possible to implement this device with other insulating materials. As shown in FIG. 16, this insulation film 15 has base apertures 50 formed so as to be opposite to P-type base layer 13 and the emitter aperture 51 created so as to be opposite to N⁺-type emitter layer 14.

The nitride film 16 is formed on the upper surface of insulation film 15. Nitride film 16 may be, for example, silicon nitride ($Si_3N_4$) though other insulators may be used. The nitride film 16 of semiconductor device 1h has nitride film apertures 52 formed, as shown in FIG. 16, between base apertures 50 and emitter aperture 51.

For semiconductor device 1h, emitter aperture 51 and nitride film apertures 52 are formed with a tapered shape. More specifically, nitride film 16 near emitter aperture 51 is etched to form nitride film apertures 52 in a tapered shape by, for example, using a Chemical Dry Etching (Chemical Dry Etching; CDE) technique.

The extraction electrode 17 is formed in the nitride film apertures 52 and emitter aperture 51. The emitter electrode 18 is formed on the upper surface of extraction electrode 17. Base electrodes 19 are formed in base apertures 50.

Polysilicon doped with arsenic (As), for example, may be used to form extraction electrode 17. Emitter electrode 18 and base electrode 19 may be formed with, for example, aluminum (Al). Collector electrode 12 may be formed using, for example, gold (Au) or silver (Ag) paste.

Although the nitride film apertures 52 are described in this embodiment as symmetric around the longer direction of emitter apertures 51, as in FIG. 1, this is an example, and other locations, arrangements, or counts may be used without departing from the present disclosure. However, it is somewhat easier to achieve certain performance effects using a symmetric arrangement.

Semiconductor device 1h has an NPN-type bipolar transistor structure similar to the semiconductor device 1a. The operating principles thereof are as follows: first, a forward bias is applied to the PN junction formed by the P-type base layer 13 and the N⁺-type diffusion collector layer 21 (N⁺-type-implanted collector layer 20) via base electrode 19, and base current is made to flow. Due to the flow of this base current, semiconductor device 1h will move to ON state, and electrons will flow from the emitter electrode 18 to the collector electrode 12 via the N⁺-type emitter layer 14, the N-type collector layer 10, the N⁺-type-implanted collector layer 20 and the N⁺-type diffusion collector layers 21. That is, current will flow from the collector electrode 12 to the emitter electrode 18.

By creating the nitride film apertures 52 (third apertures) in between base apertures 50 and emitter aperture 51 and in between base apertures 50 and collector apertures 53, the crystal defects that may occur during the thermal changes associated with the manufacturing of semiconductor device 1h are suppressed. As a result, it is possible to reduce the leakage current (leakage current between the emitter electrode 18 and the base electrode 19) during device operation.

Also, in the case of the semiconductor device 1h according to the third embodiment, the emitter aperture 51 and the nitride film apertures 52 are created in a tapered shape, so they decrease the nitride film 16 that exerts a tensile stress relative to the semiconductor substrate 2. More specifically, the area of the extraction electrode 17, which has a compressive stress, that is in contact with the nitride film 16, which exerts a tensile stress, is increased when the nitride film apertures 52 have tapering. Consequently it becomes possible to better achieve the effects described above.

When it is desired to create the emitter contact minutely (when emitter aperture 51 is to be narrow in width), techniques in which the sidewalls of emitter aperture 51 are not tapered are desirable. Since it is difficult to use the CDE method to create narrow features, the fabrication process can be adjusted so only nitride film apertures 52 are formed using the CDE method to generate a tapered shape. A structure such as that of the semiconductor device 1i in which only the nitride film apertures 52 are created in tapered shape, as shown in FIG. 17, can be formed.

Although, for example, silicon (Si) can be used as the semiconductor according to the example embodiments, embodiments may be implemented by using compound semiconductors of silicon carbide (SiC), gallium nitride (GaN) or wide gap semiconductors such as diamond.

Also, although the manufacturing method has been described by assuming an ion implantation method, implementation is also possible with techniques that use epitaxial growth or both ion implantation and epitaxial growth, and there are no particular limitations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
 a semiconductor substrate of a first conductivity type;
 a first semiconductor layer of a second conductivity type formed on a first face of the semiconductor substrate, the second conductivity type being of an opposite conductivity of the first conductivity type;
 a second semiconductor layer of the first conductivity type formed in the first semiconductor layer;
 a first insulation film formed over the first and second semiconductor layers on the first face of the semiconductor substrate, first insulation film having a first aperture forming an opening to the first semiconductor layer and a second aperture forming an opening to the second semiconductor layer;
 a second insulation film formed over the first insulation film, the second insulation film having at least one third aperture located between the first aperture and the second aperture;
 a first main electrode formed on a second face of the semiconductor substrate opposite to the first face;
 a second main electrode formed in the first aperture; and a third main electrode formed in the second aperture and the at least one third aperture.

2. The semiconductor device according to claim 1, wherein multiple third apertures are formed intermittently along the longer direction of the second apertures.

3. The semiconductor device according to claim 2, wherein the multiple third apertures are formed symmetrically around the second aperture.

4. The semiconductor device according to claim 1, wherein the second insulation film is under a tensile stress relative to the semiconductor substrate, and
the third main electrode is under a compressive stress relative to the semiconductor substrate.

5. The semiconductor device according to claim 1, wherein said at least one third aperture has a tapered shape.

6. The semiconductor device according to claim 5, wherein the second aperture has a tapered shape through the second insulation film.

7. The semiconductor device according to claim 1, wherein the first insulation film is silicon dioxide.

8. The semiconductor device according to claim 1, wherein the second insulation film is silicon nitride.

9. A semiconductor device comprising:
a semiconductor substrate with a region of a first conductivity type, the semiconductor substrate having a first face and a second face opposite the first face;
a first semiconductor layer of a second conductivity type formed on the first face of the semiconductor substrate, the second conductivity type being of an opposite conductivity of the first conductivity type;
a second semiconductor layer of the first conductivity type in the first semiconductor layer;
a first insulation film formed over the first semiconductor layer and the second semiconductor layer;
a second insulation film formed over the first insulation film;
a first main electrode formed in contact with the region of first conductivity type;
a second main electrode that penetrates through the first insulation film and the second insulation film and makes contact with the first semiconductor layer;
a third main electrode that has a first portion that penetrates through the first insulation film and the second insulation film and makes contact with the second semiconductor layer, and a second portion that penetrates through the second insulation film and makes contact with the first insulation film.

10. The semiconductor device of claim 9, wherein the first main electrode is formed on the second face of the semiconductor substrate.

11. The semiconductor device of claim 9, wherein the first main electrode is formed on the first face of the semiconductor substrate.

12. The semiconductor device of claim 9, wherein
the first main electrode comprises gold or silver paste,
the second main electrode comprises aluminum, and
the third main electrode comprises doped polysilicon.

13. A semiconductor device manufacturing method, comprising:
forming a first semiconductor layer of a second conductivity type on a first face of a semiconductor substrate of a first conductivity type, the second conductivity type being of an opposite conductivity of the first conductivity type;
forming a second semiconductor layer of the first conductivity type in the first semiconductor layer;
forming a first insulation film on top of the first semiconductor layer;
forming a second insulation film over the first insulation film;
forming first apertures in the first and second insulation films, such that the first apertures are opposite to the first semiconductor layer;
forming a second aperture in the first and second insulation films such that the second aperture is opposite to the second semiconductor layer;
forming at least one third aperture in the second insulation film, such that the at least one third aperture is between at least one of the first apertures and the second aperture;
forming a first main electrode on the semiconductor substrate;
forming a second main electrode in the first aperture;
forming a third main electrode in the second aperture and the at least one third aperture.

14. The semiconductor device manufacturing method according to claim 13, wherein the first main electrode is formed on a second face of the semiconductor substrate, the second face opposite to the first face.

15. The semiconductor device manufacturing method according to claim 13, wherein multiple third apertures are formed intermittently along a longer dimension of the second aperture.

16. The semiconductor device manufacturing method according to claim 15, wherein the multiple third apertures are formed so as to be symmetric in the longer dimension of the second apertures.

17. The semiconductor device manufacturing method according to claim 13, wherein at least one of the second aperture and the at least one third aperture are formed in a tapered shape.

18. The semiconductor device manufacturing method according to claim 13, wherein
the second insulation film is under a tensile stress relative to the semiconductor substrate, and
the third main electrode is under a compressive stress relative to the semiconductor substrate.

* * * * *